US006597295B1

United States Patent
Fukuyama

(10) Patent No.: US 6,597,295 B1
(45) Date of Patent: Jul. 22, 2003

(54) DECODING APPARATUS AND DECODING METHOD

(75) Inventor: Mariko Fukuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/695,209

(22) Filed: Oct. 24, 2000

(30) Foreign Application Priority Data

Nov. 1, 1999 (JP) .......................................... P11-311262

(51) Int. Cl.$^7$ ................................................ H03M 5/00
(52) U.S. Cl. ............................. 341/58; 341/59; 341/68; 341/69; 375/287; 375/340; 714/709
(58) Field of Search ............................. 341/58, 59, 68, 341/69; 375/287, 340; 714/709

(56) References Cited

U.S. PATENT DOCUMENTS

| | | | | |
|---|---|---|---|---|
| 4,606,047 A | * | 8/1986 | Wilkinson | 375/38 |
| 5,298,899 A | * | 3/1994 | Oh et al. | 341/132 |
| 5,313,472 A | * | 5/1994 | Hara | 371/31 |
| 5,341,379 A | * | 8/1994 | Crisp | 371/6 |
| 5,506,581 A | * | 4/1996 | Ino et al. | 341/58 |
| 5,633,631 A | * | 5/1997 | Teckman | 341/58 |
| 5,675,569 A | * | 10/1997 | Yamaguchi et al. | 369/124 |
| 5,764,166 A | * | 6/1998 | Yoshimura et al. | 341/58 |
| 5,790,595 A | * | 8/1998 | Benthin et al. | 375/224 |
| 6,169,769 B1 | * | 1/2001 | Kawaguchi | 375/316 |
| 6,211,698 B1 | * | 4/2001 | Suh | 326/60 |
| 6,233,715 B1 | * | 5/2001 | Kuki et al. | 714/795 |

* cited by examiner

Primary Examiner—Michael Tokar
Assistant Examiner—Khai Nguyen
(74) Attorney, Agent, or Firm—Oblon, Spivak, McClelland, Maier & Neustadt, P.C.

(57) ABSTRACT

A data-decoding apparatus having bit-detecting section 4. In the apparatus, an RF signal is reproduced from a recording medium and converted to digital data. If the RF signal has a level (amplitude) equal to a comparator level, the bit-detecting section 4 outputs channel-bit data having logic level "0" or "1" in accordance with whether the sum of the amplitudes of the two RF signals respectively preceding and following that RF signal is higher or lower than the comparator level.

10 Claims, 5 Drawing Sheets

DECODING APPARATUS AND DECODING METHOD

BACKGROUND OF THE INVENTION

The present invention relates to a decoding apparatus and decoding method for decoding an RF signal reproduced and read from a recording medium on which data is recorded in the form of RLL (Run Length Limited) codes, in accordance with at least one comparator level, thereby to output channel-bit data.

To transmit data or to record data on a recording medium such as a magnetic disk, an optical disk or a magneto-optical disk, the data is modulated to data that may be well transmitted or recorded. Known as one method of modulating data is block encoding. In the block encoding, a stream of data is divided into blocks (hereinafter referred to as "data words"), each consisting of m×i bits. The data words are converted to code words in accordance with appropriate encoding rules. It should be noted that each code word is composed of (n×i) bits. The code word has a fixed length if i=1. If i is of maximum value $i_{max}$=r, where r is 2 or more, the code word has a variable length. The blocks, or data words, shall be called variable-length codes (d, k; m, n; r). The value i is called "restraint length" here, and "r" is the maximum restraint length. The value d is the smallest number of "0s" that may exist between two "1s" in a series of codes, and the value k is the largest number of "0s" that may exist between two "1s" in the series of codes.

The modulation applied to compact disks (CDs) will be described as an example of a method of modulating data. EFM (Eight-to-Fourteen Modulation) is used to record data on a CD. More precisely, an 8-bit data word is converted to a 14-bit code word (channel bits), three margin bits are added to the 14-bit code word, thus reducing the DC component in the code word (i.e., EFM word), and the code word is then recorded by means of NRZI modulation. The 8-bit data word is converted to a 14-bit code word and the margin bits are added, such that the smallest number of "0s" and largest number of "0s" may be 2 and 10, respectively. Hence, the parameter of this modulation is (2, 10; 8, 17; 1). The minimum inversion interval $T_{min}$ is 3 (=2+1)T, where T is the interval between bits in a channel-bit stream (a series of recorded waves). The maximum inversion interval $T_{max}$ is 11 (=10+1)T. The width $T_w$ of the detection window is (m/n)×T, where T is the interval $T_{data}$ between data items in a stream of data items, and has the value of 0.47 (=8/17)T.

The minimum length d' defined by identical symbols in the code word that has been NRZI-modulated is: d'=d+1= 2+1=3. On the other hand, the maximum length k' defined by identical symbols in the code word is: k'=k+1=10+1=11.

With the CD described above, the recording density can be increased if bits are compressed in the linear-speed direction. When the bits are compressed, the minimum bit length that corresponds to the minimum inversion interval $T_{min}$ will decrease. If the minimum bit length decreases excessively, it will be difficult to detect the bits, causing an error.

The error rate in the process of reproducing data from a disk will increase if a skew occurs, that is, if the optical pickup is inclined to the recording surface of the disk. The skew is classified into two types in accordance with the direction in which the optical axis of the pickup inclines to the disk. The first type occurs in a tangential direction in a plane parallel to the direction in which the pickup moves and perpendicular to the disk. The second type occurs in a radial direction in a plane parallel to the radial direction of the disk and perpendicular to thereto. The error rate increases in the tangential direction at a relatively early stage of the process of reproducing data. Both types of skews inevitably reduce the design margin of the system.

The distribution of errors in the minimum length defined by identical symbols was checked in the two skew directions. The errors due to the skew in the tangential direction occurred when the minimum length defined by identical symbols was short. That is, the error rate increased because the code word having a length $T_{min}$ (d') was decoded to a data item having a length of $T_{min}-1$ (d'-1). It was found that many errors were made in the EFM system when 3T (i.e., minimum inversion interval $T_{min}$) was changed to 2T, where T is the interval between bits in a series of recorded waves.

The waves reproduced have their form more distorted when the recording density is increased in the linear-speed direction or when a skew of a large angle takes place in the process of reproducing data from the disk. Thus, the error rate increases as the code word having a length $T_{min}$ (d') is decoded to one having a length $T_{min}-1$ (d'-1) and the code word having a length $T_{min}-1$ (d'-2) is decoded to one having a length $T_{min}-1$ (d'-3). In other words, errors occur in the EFM system when 3T (i.e., minimum inversion interval T min), where T is the interval between bits in a series of recorded waves, is decoded to 2T, 2T is then decoded to 1T, and further 1T is decoded to 0T. Here, "0T" means that the output is too small or too large to cross the comparator level, or that the output cannot be detected at all.

RLL (1,7) codes, which are often used in the modulation performed in magneto-optical recording systems will be described. The parameter of an RLL code (1,7) is (1, 7; 2, 3; 2). The minimum inversion interval $T_{min}$ is 2 (=1+1)T and the maximum inversion interval $T_{max}$ is 8 (=7+1), where T is the interval between bits in a series of recorded waves.

In the process of reproducing data, using the RLL (1, 7) code, an error is made when the recording density is increased in the linear-speed direction or when a skew of a large angle occurs. That is, the minimum inversion interval $T_{min}$, i.e., 2T, is decoded to 1T, and further 1T is decoded to 0T, where T is the interval between bits in a series of recorded waves.

The value 0T, i.e., an error that can no longer be detected, is often obtained in the case where d=1 in the RLL code (1, 7). This is inevitably because it is believed that 2T is more easily decoded to 1T and then to 0T when d=1 than when d=2, though the waves reproduced must be much distorted to be detected as an error when d=2 and 3T is therefore decoded to 2T, thence to 1T, and thence to 0T.

Some asymmetry margin is provided in the manufacture of optical disks. It is therefore necessary to take into consideration a case where the waves reproduced are asymmetric with respect to the center level.

Viterbi decoding may be employed to reduce the error rate in the process of reproducing signals. Viterbi decoding is one of decoding methods in which code errors are minimized, thereby finding the geometrically shortest way possible, discarding other ways of less likelihood. In other words, Viterbi decoding is a decoding method in which the value having the highest likelihood is searched for in a simple manner. An algorithm for compensating for the minimum inversion interval $T_{min}$ can be utilized in Viterbi decoding.

Viterbi decoding, however, is disadvantageous in that a complicated circuit of a large scale must be used to perform it. This decoding method cannot decode data without making errors, if the data has been reproduced from a recording medium that has an asymmetry margin like an optical disk. The circuit for performing Viterbi decoding should therefore be designed to cope with the asymmetry margin and is, inevitably, more complicated in structure.

A recording medium, such as an optical disk, may hardly have a sufficient skew margin. The skew margin is inadequate, particularly in the tangential direction.

It is difficult to reproduce data from a recording medium having high recording density, such as an optical disk, at with a stable minimum inversion interval $T_{min}$. Inevitably, the error rate increases.

The inventors of the present invention has proposed in Japanese Patent Application No. 8-139264 that a run-detector be used to decrease the error rate in processing signals, by means of a circuit of a more simple structure.

In the invention of Japanese Patent Application No. 8-139264, a data decoder corrects $T_{min}$ when d=2, thereby decreasing the bit error rate. The data decoder comprises two major components, i.e., an input signal processing section and a data decoding section.

The data decoding section samples an RF signal reproduced, with a bit-clock signal supplied from the input signal processing section. The RF signal thus sampled is quantized. Meanwhile, the comparator level detected in the input signal processing section is sampled and quantized. The comparator level thus quantized is compared with the level of the RF signal quantized, by using the bit-clock signal, in a bit detecting section. If the level (amplitude) of the RF signal reproduced is equal to or higher than the comparator level, the bit detecting section outputs a channel bit data (binary signal) of logic level "1." If the level of the RF signal reproduced is lower than the comparator level, the bit detecting section outputs a channel bit data (binary signal) of logic level "0."

If a recording medium of high recording density, such as an optical disk, has high asymmetry, the bit detecting section outputs will output a channel bit data (binary signal) of logic level "0 " even if when the amplitude of the RF signal is equal to the comparator level. Consequently, the accuracy of the decoding performed by the data decoding section may decrease in some cases.

BRIEF SUMMARY OF THE INVENTION

The present invention has been made in view of the foregoing. The object of the invention is to provide a decoding apparatus and decoding method that can decode a reproduced RF signal with a high accuracy even if the level (amplitude) of the RF signal is equal to the comparator level at the time of detecting a bit.

A data-decoding apparatus according to this invention compares the level of data with a threshold level, thereby to generating a decoded bit. The apparatus comprises decoded-bit determining means, which determines whether the decoded bit is "1" or "0" from the levels of two data items respectively preceding and following the data when the data has a level equal to the threshold level.

A data-decoding method according to the present invention is designed to decode a bit by comparing the level of input data with a threshold level, thereby generating a decoded bit. In the method, it is determined whether the decoded bit is "1" or "0" from the levels of two data items respectively preceding and following the input data, when the level of the input data is equal to the threshold level.

In the present invention, the accuracy of decoding the reproduced RF can be increased even if the level (amplitude) of the RF signal is equal to the comparator level at the time of detecting a bit.

DETAILED DESCRIPTION OF THE INVENTION

An embodiment of the present invention will be described, with reference to the accompanying drawings. In the embodiment, a magneto-optical disk is used as the recording medium, and a binary level (d, k) is decoded. The level (d, k) has a minimum length d defined by identical symbols and a maximum length k defined by identical symbols, where d=1 and k=7. More specifically, the embodiment is a data-decoding apparatus that reproduces a stream of NRZI-modulated channel bits from the binary code, which has been recorded on the magneto-optical disk by means of NRZI modulation. The code (1, 7) is a code representing an edge. The NRZI-modulated channel bits constitute a code that represents the level corresponding to the shape of the pits made in the surface of the magneto-optical disk. The minimum length d' defined by identical symbols in the NRZI-modulated code is: d'=d+1=1+1=2, and the maximum length k' defined by identical symbols in this code: k'=k+1=7+1=8.

Figure 1:
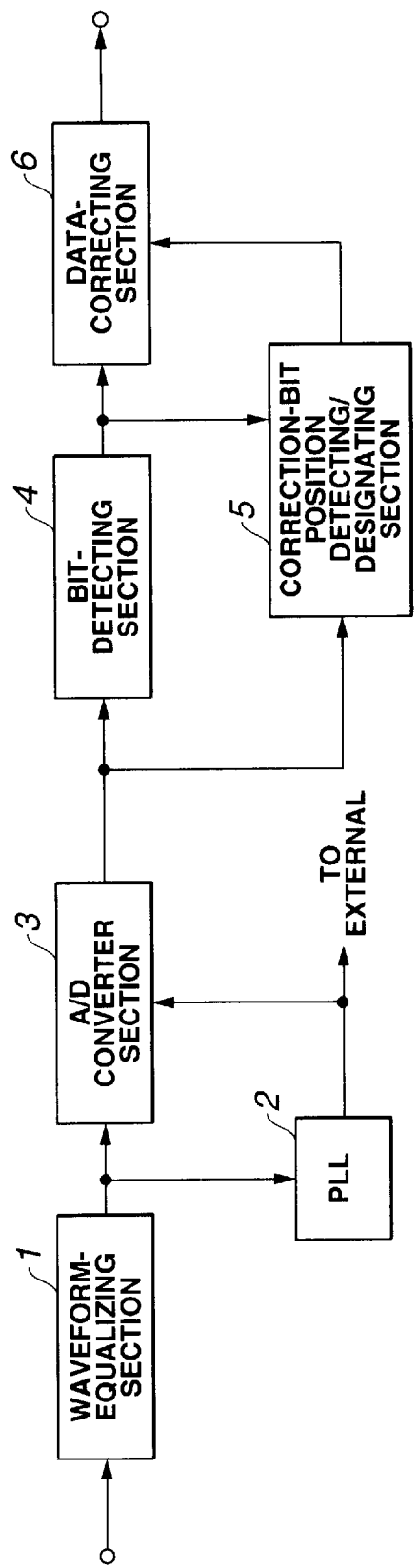
FIG. 1 is a block diagram of a data-decoding apparatus, which is an embodiment of the present invention.

FIG. 1 is a block diagram showing the data-decoding apparatus, i.e., an embodiment of this invention. The data-decoding apparatus comprises a waveform-equalizing section 1, a bit-clock generating section 2, an A/D converter section 3, a bit-detecting section 4, a correction-bit position detecting/designating section 5, and a data-correcting section 6. The waveform-equalizing section 1 receives an RF signal reproduced from a magneto-optical disk (not shown). The bit-clock generating section 2 and A/D converter section 3 receive the output of the waveform-equalizing section 1. The bit-clock generating section 2 comprises a PLL circuit. The output of the A/D converter section 3 is supplied to the bit-detecting section 4 and correction-bit position detecting/designating section 5. The outputs of the bit-detecting section 4 and the correction-bit position detecting/designating section 5 are supplied to the data-correcting section 6.

In the data-decoding apparatus, the waveform-equalizing section 1 equalizes the waveform of the analog signal input, i.e., an RF signal reproduced from the magneto-optical disk (not shown). In the bit-clock generating section 2, the PLL circuit generates a bit-clock signal from the RF signal the waveform of which has been equalized by the waveform-equalizing section 1. The A/D converter section 3 performs A/D conversion on the RF signal, in synchronism with the bit-clock signal generated by the bit-clock generating section 2. Thus, the A/D converter section 3 samples the RF signal at a prescribed sampling rate. The RF signal, whose waveform has been equalized by the waveform-equalizing section 1, is thereby converted to digital data.

The bit-detecting section 4 compares the bits constituting the digital data output from the A/D converter section 3, with a comparator level that is a center level. In other words, the bit-detecting section 4 determines whether each bit is "1" or "0", using the center level as a reference. If the bit has a level (the amplitude of RF signal) that is higher than the comparator level, the bit-detecting section 4 generates channel-bit data having logic level "1." If the bit has a level that is lower than the comparator level, the section 4 generates channel-bit data having logic level "0." If the bit has a level that is equal to the comparator level, the bit-detecting section 4 generates channel-bit data having logic level "0" or "1" in accordance with the whether the sum of the levels of the two bits preceding and following the bit, respectively, is higher or lower than the comparator level.

Figure 2:
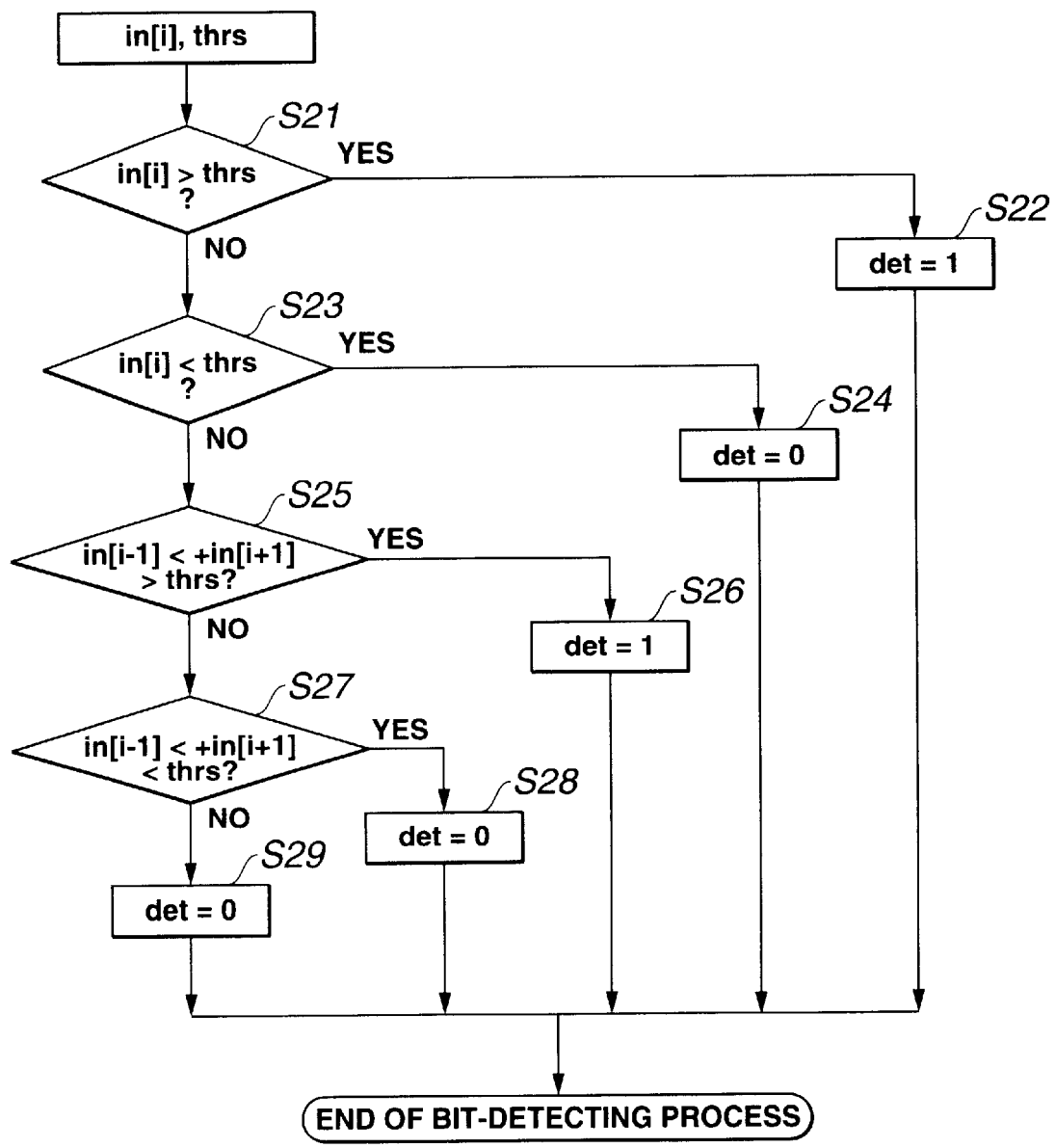
FIG. 2 is a flowchart explaining the operation of the data-decoding apparatus.

How the bit-detecting section 4 detects bits will be explained, with reference to the flowchart of FIG. 2. The level (amplitude) in[i] of the RF signal output from the A/D converter section 3 is compared with the comparator level thrs of the bit-detecting section 4, thus generating a decoded bit (det).

First, in Step S21, it is determined whether the amplitude in[i] is greater than the comparator level thrs. If the amplitude in[i] is greater than the level thrs, the operation advances to Step S22. In Step S22, the decoded bit det is set at "1" (that is, the section 4 outputs a channel-bit data having a logic level "1"). If the amplitude in[i] is found not greater than the level thrs in Step S21, the operation goes to Step S23. In Step S23, it is determined whether the amplitude in [i] is less than the comparator level thrs. If the amplitude in[i] is less than compactor level thrs, the operation goes to Step S24, in which the decoded bit det is set at "0" (that is, the section 4 outputs a channel-bit data having a logic level "0").

Figure 3:
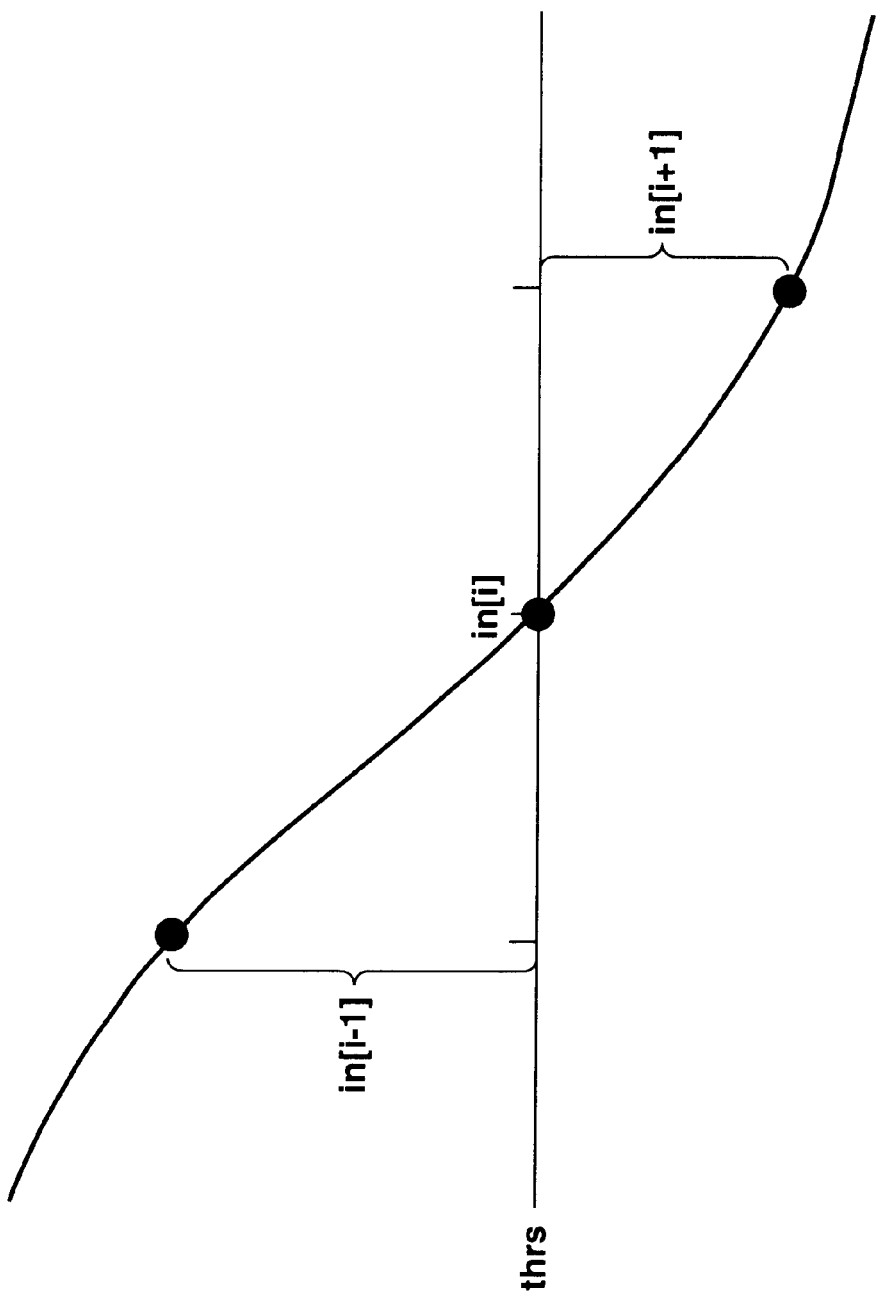
FIG. 3 is a diagram explaining how the data-decoding apparatus operates.

If the amplitude in[i] is found not less than the comparator level thrs in Step S23, that is, if the amplitude in[i] is equal to the comparator level thrs, the operation advances to Step S25. In Step S25, the amplitude in[i−1] of the bit preceding the bit to be detected is added to the amplitude in[i+1] of the bit following the bit to be detected. Then, it is determined whether the resultant sun, in[i+1]+in[i+1], is greater than the comparator level. (As shown in FIG. 3, the amplitudes in[i−1] and in[i+1] are respectively greater and less than the amplitude in[i]. Hence, subtraction is performed.) If the sum thus obtained is greater than the comparator level, the operation goes to Step S26, in which the detected bit det is set at "1." If the sum is not greater than the comparator level, the operation goes to Step S27. In Step S27, it is determined whether the sum, in[i−1]+in[i+1], is less than the comparator level. If the sum is found less than the comparator level, the operation advances to Step S28, in which the detected bit is set at "0." If the sum is found not less than the comparator level (that is, if the sum, in[i−1]+in[i+1], is equal to the comparator level), the operation goes to Step S29. In Step S29, the detected bit is set at "0," too.

Thus, the bit-detecting section 4 does not set the decoded bit det at logic level "0" merely because the amplitude in[i] is equal to the comparator level thrs. Rather, the section 4 selects a decoded bit that is found to have high likelihood, in view of the relation between the preceding bit and the following bit.

The correction-bit position detecting/designating section 5 detects a part of the channel-bit data generated by the bit-detecting section 4, on the basis of the digital data output from the A/D converter section 3. This part of the channel-bit data has been decoded during an erroneous minimum inversion interval ($T_{min}-2$), not during the correct minimum inversion interval $T_{min}$. If the code (d,k) is code (1, 7), for example, the section 5 detects that part of the channel-bit data which has been decoded during an interval 0T, not during an interval 2T (i.e., the minimum inversion interval $T_{min}$), where T is the bit interval in a wave stream. The correction-bit position detecting/designating section 5 outputs a correction-bit position designating signal that designates an erroneous bit position that should be corrected.

The data-correcting section 6 corrects the channel-bit data generated by the bit-detecting section 4, in accordance with the correction-bit position designating signal supplied from the correction-bit position detecting/designating section 5. More specifically, if three consecutive bits supplied from the bit-detecting section 4 are of the same symbol and if the sample level of the second bit falls within the range of thrs ±α, the section 6 inverts the second bit, thus correcting the same to 1T. 1T is detected from the stream of bits thus corrected and changed to 2T by comparing the sample levels of the first and third bits. If the sample levels are equal to each other, the edge identical to the one corrected immediately before is corrected. The data-correcting section 6 outputs the channel-bit data thus corrected.

In the data-decoding apparatus, the bit-detecting section 4 does not set the decoded bit det at logic level "0" merely because the amplitude in[i] is equal to the comparator level thrs. Rather, the section 4 selects a decoded bit that is found to have high likelihood, in view of the relation between the preceding bit and the following bit. Hence, the operating efficiency of the run detector can increase.

Another data-decoding apparatus, which is the second embodiment of the invention, will be described. The second embodiment is similar in structure to the first embodiment shown in FIG. 1. Therefore, the structure of this data-decoding apparatus will not be described in detail. In the second embodiment, a waveform of prominent asymmetry is detected in the form of bits, with reference to the comparator level. If the amplitude of the waveform is equal to the comparator level, the preceding amplitude and the following amplitude are weighted to cancel out the asymmetry. It is then determined whether the decoded bit is "0" or "1" in accordance with whether the sum of the two amplitudes is greater than the comparator level.

More precisely, the level in[i] (amplitude) of the RF signal output from the A/D converter section 3 is compared with the comparator level thrs of the bit-detecting section 4, thereby to determine the decoded bit (det). If NO in Step S23, weights (*a and *b) are applied to the preceding amplitude in[i−1] and the following amplitude in[i+1], respectively, in order to cancel the asymmetry. The sum of the amplitudes in[i−1] and in[i+1] is compared with the comparator level.

Figure 4:
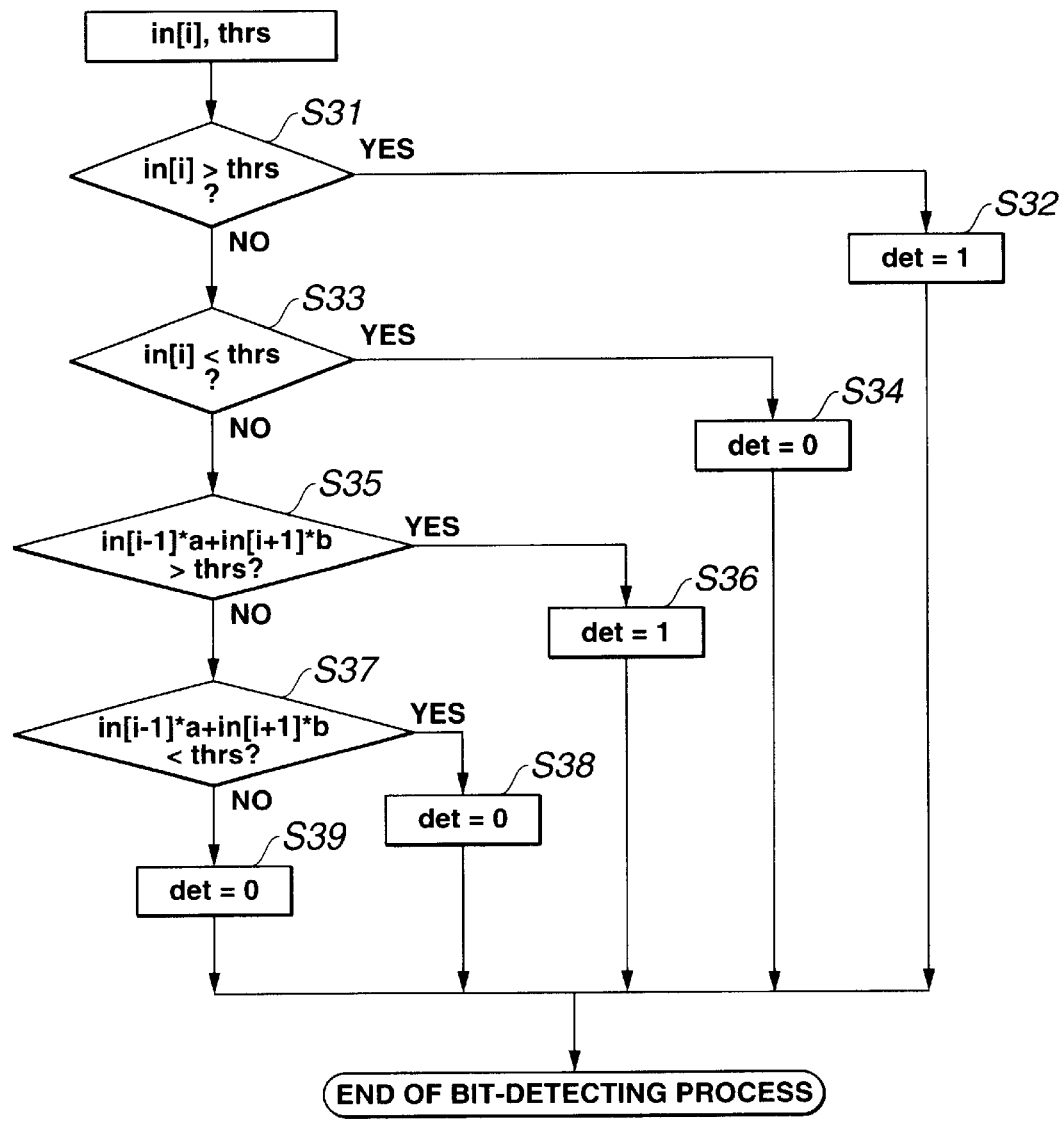
FIG. 4 is a flowchart explaining the operation of another embodiment of the present invention.

How the second embodiment operates will be explained in detail, with reference to the flowchart of FIG. 4. Steps S31 to S34 are identical to Step S21 to S24 of the flowchart shown in FIG. 2.

If it is determined in Step S33 that the amplitude in[i] is not smaller than the comparator level thrs, that is, if the amplitude in[i] is equal to the comparator level thrs, the operation goes to Step S35. In Step S35, the amplitudes in[i−1]*a and in[i+1]*b of the two bits preceding and following the bit to be detected are added, and the sum is compared with the comparator level. In other words, it is determined in Step S35 whether the sum, in[i−1]*a+in[i+1] *b, is greater than the comparator level. (Subtraction is performed since the amplitudes in[i−1]*a and in[i+1]*b are respectively greater and less than the amplitude in[i].) If the sum is greater than the comparator level, the operation advances to Step S36, in which the decoded bit det is set at "1." If the sum is not greater than the comparator level, the operation advances to Step S37. In Step S37, it is determined whether the sum, in[i−1]*a +in[i+1]*b, is smaller than the comparator level. If YES in Step S37, the operation goes to Step S38, in which the detected bit det is set at "0." If NO in Step S37 (that is, if in[i−1]*a+in[i+1]*b is equal to the comparator level), the operation goes to Step S39. In Step S39, too, the detected bit det is set at "0."

Thus, the bit-detecting section 4 does not set the decoded bit det at logic level "0" merely because the amplitude in[i] is equal to the comparator level thrs. Rather, the section 4 selects a decoded bit found to have high likelihood, in view of the relation between the two bits respectively preceding and following bit.

Figure 5:
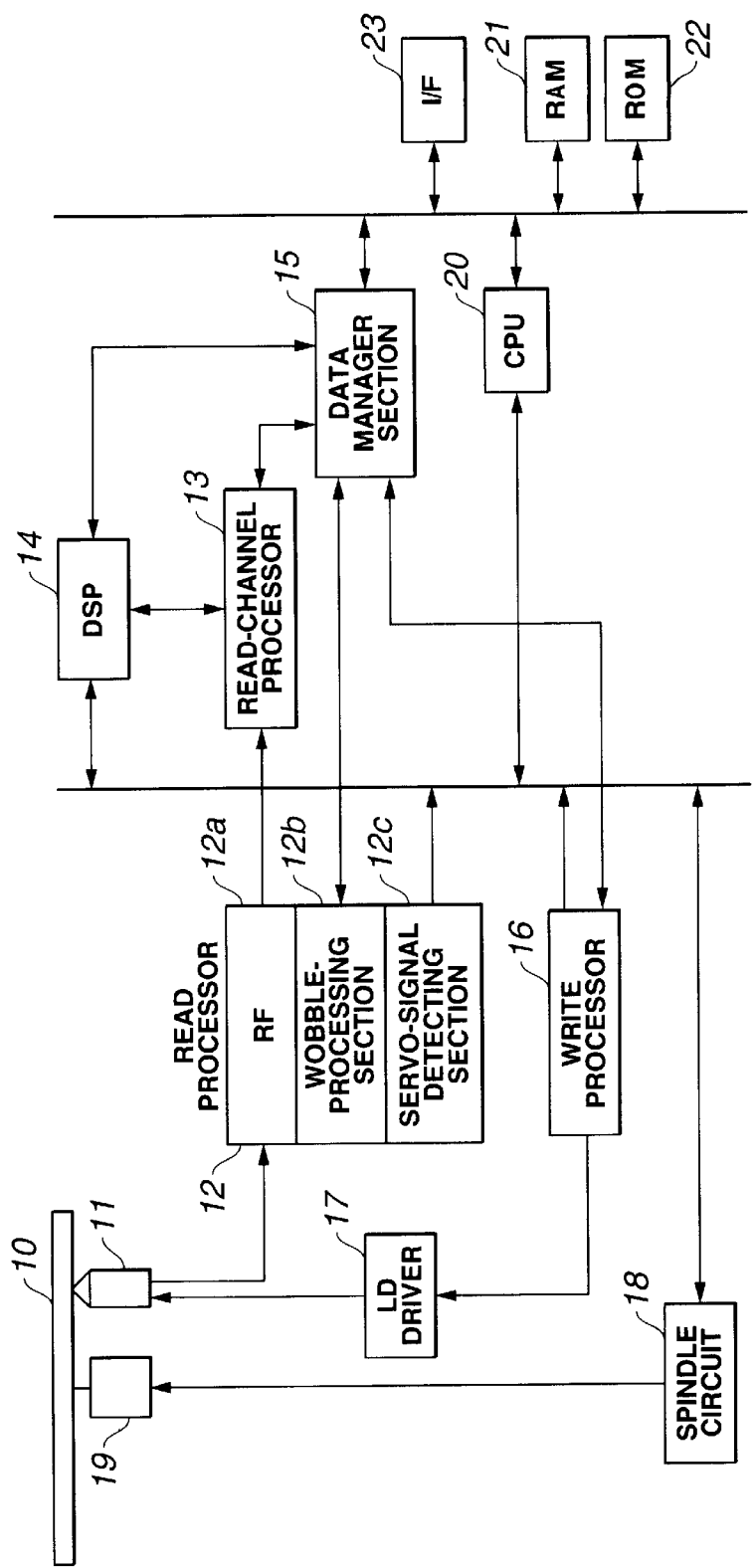
FIG. 5 is a block diagram of an optical disk drive in which a data decoding method according to the invention is performed.

An optical disk drive incorporating the data-decoding apparatus shown in FIG. 1 will be described, with reference to FIG. 5. The optical disk drive comprises an optical head (OP head) 11, a read processor 12, a read-channel processor 13, a digital-signal processor (DSP) 14, and a data manager section 15. The OP head 11 applies a laser beam to the signal-recording surface of an optical disk 10, thereby to record data on, and read data from, the optical disk 10. The read processor 12 performs RF process, wobble detection and servo detection on signals the OP head 11 has read from the optical disk 10. (The RF process, wobble detection and servo detection will be described later.) The read-channel processor 13 extracts, from the output of the read processor 12, address data and channel-bit data of the data recorded on the disk 10, by the data-decoding method according to the present invention. The DSP 14 has a demodulating section, a modulating section and a servo-processing section. The demodulating section demodulates the channel bit supplied from the read-channel processor 13, thereby to demodulate the address data and recorded data. The modulating section modulates data before the data is recorded on the optical disk 10. The data manager section 15 processes the data demodulated by the DSP 14 and the recorded data and decodes the address data.

The optical disk drive further comprises a write processor 16, an LD driver 17, a spindle circuit 18, and a spindle motor 19. The write processor 16 performs write process on the data to be recorded, in accordance with the user's instruction. The LD driver 17 achieves automatic power control (APC) of, for example, the laser diode provided in the OP head 11, in accordance with the laser-driving pulse supplied from the write processor 16. The spindle circuit 18 controls the spindle motor 19. Under the control of the spindle circuit 18, the spindle motor 19 rotates the optical disk 10.

The optical disk drive has a CPU 20, a RAM 21, a ROM 22, and an interface (I/F) 23, too. The ROM 22 stores an application program. The CPU 20 reads the application program from the ROM 22 and writes the same into the RAM 21. The CPU 20 also writes, into the RAM 21, an application program down-loaded from a host computer via the I/F 23. In accordance with the application programs the CPU 20 controls some of the other components of the optical disk. The I/F. 23 also functions as an interface for supply a read command, a write command, a bit stream of image data to be recorded, and the like, all supplied from, for example, an AV system (not shown) so that they may be processed in the optical disk drive.

The OP head 11 comprises an optical system, a reproducing IV amplifier, a two-axis actuator, and the like. The optical system has a laser diode LD.

The read processor 12 comprises a RF processing section 12a, a wobble-processing section 12b, and a servo-signal detecting section 12c. The sections 12a, 12b and 12c will be later described in detail.

The basic operation the optical disk drive carries out to record data on the optical disk 10 and reproduce data therefrom will be explained.

To record data on the optical disk 10, the I/F 23 receives a write command and a bit stream of MPEG2 image data from the AV system (not shown). The write command is supplied to the CPU 20. The CPU 20 acquires the address data from the data manager section 15. In accordance with the address data the CPU 20 causes the servo section of the DSP (digital signal processor) 14 to move the OP head 11 to the position designated by the address data. The data manager section 15 has an ECC section, which corrects errors, if any in the bit stream of image data, and encodes the image data. The modulating section of the DSP 14 modulates the bit stream thus corrected and encoded, thereby generating data to be recorded on the optical disk 10. The write processor 16 effects recording compensation on the data generated by the DSP 14. The LD driver 17 drives the laser diode LD of the OP head 11 upon receipt of a timing signal supplied from the address-decoding section of the data manager section 15. The OP head 11 therefore records the channel bit on the optical disk 10.

To reproduce data from the optical disk 10, the AV system supplies a read command to the CPU 20. In response to the read command the CPU 20 acquires address data from the address detector incorporated in the data manager section 15. In accordance with the address data, the CPU 20 causes the servo section of the DSP (digital signal processor) 14 to moves the OP head 11 to the position designated by the address data. The OP head 11 reads a signal from the optical disk 10. The PLL provided in the RF processing section 12a of the read processor 12 processes the signal, generating data. The read-channel processor 13 decodes this data, generating a channel bit. The demodulating section provided in the DSP 14 demodulates the channel bit into a bit stream. The bit stream is supplied to the data manager section 15. In the section 15, the ECC section corrects errors, if any in the bit stream, and decodes the bit stream. The bit stream, thus reproduced, is supplied to the AV system through the I/F 23.

To record or reproduce data, the wobble-processing section 12b of the read processor 12 detects a wobble signal from the signal read by the optical head 11. The section 12b generates a sync signal from the wobble signal. The sync signal is supplied to the address detector provided in the data manager section 15.

To record or reproduce data, the RF processing section 12a of the read processor 12 performs waveform equalization, PLL (Phase Locked Loop) process, AGC (Automatic Gain Control), and ADC (Analog-to-Digital Conversion) on the signal the OP head 11 has reproduced from the optical disk 10.

The digital output of the RF processing section 12a is supplied, as RF-A/D data, to the read-channel processor 13. The read processor 12 detects the address data recorded next to the sector mark SM in the address data area of the optical disk 10. The address data is supplied to the read-channel processor 13. A clock signal wck associated with the address data is supplied to the read-channel processor 13, too. Meanwhile, the wobble-processing section 12b detects a wobble signal from the signal (a push-pull signal) read by the optical head 11. The wobble signal is supplied, as a reference clock signal, to the read-channel processor 12. The servo-signal detecting section 12c detects a servo signal, which is used to accomplish the servo control of the two-axis actuator provided in the OP head 11 and to move the OP head 11 to the position designated by the address data.

The read-channel processor 13 performs bit-detecting process and data-correcting process, detecting the channel bit of the recorded data and the channel bit of the address data. In the bit-detecting process, the digital data output from the RF processing section 12a of the read processor 12 is compared with the center level, i.e., the comparator level. It is thereby determined whether the digital data is "1" or "0." If the level (amplitude) of the digital data is higher than the comparator level, the read-channel processor 13 outputs a channel-bit data of logic level "1." If the level of the digital data is lower than the comparator level, the read-channel processor 13 outputs a channel-bit data of logic level "0." The bit-detecting process, the level (amplitude) of the digital data may be found equal to the comparator level. If so, the read-channel processor 13 may output a channel-bit data of logic level "0" or a channel-bit data of logic level "1." In the data-correcting process, the channel bit data obtained in the bit-detecting process is corrected on the basis of a correction-bit position designating signal that designates the process of detecting the position of the bit to be corrected. In the (1, 7) modulation, for example, three consecutive bits may be of the same logic level and the second of these bit may have a level of thrs ±α. In this case, the second bit is inverted and thus corrected to 1T. 1T is detected from the stream of bits thus corrected and changed to 2T by comparing the sample levels of the first and third bits. If the sample levels are equal to each other, the edge identical to the one corrected immediately before is corrected. The channel-bit data thus corrected is output, as the result of the data-correcting process. Note that the read-channel processor 13 outputs two data items, i.e., the three-channel bit data of the address data and the two-channel bit data of the recorded data.

Performing the data-decoding method of the invention, the optical disk drive can decode data with high accuracy even if the level (amplitude) of the RF signal reproduced is found equal to the comparator level in the bit-detecting process performed in the read-channel processor 13.

What is claimed is:

1. A data-decoding apparatus for comparing a logic level of data with a threshold level, thereby generating a decoded bit, said apparatus comprising:

decoded-bit determining means for determining the logic level of the data from the levels of two data items respectively preceding and following the data when the data has a level equal to the threshold level, wherein the decoded-bit determining means sets the decoded bit at a first logic level when the sum of the two data items respectively preceding and following the data is higher than the threshold level.

2. The data-decoding apparatus according to claim 1, wherein the decoded-bit determining means sets the decoded bit at a second logic level when the sum of the two data items respectively preceding and following the data is lower than the threshold level.

3. The data-decoding apparatus according to claim 1, wherein the decoded-bit determining means sets the decoded bit at the first logic level or the second logic level when the sum of the two data items respectively preceding and following the data is equal to the threshold level.

4. The data-decoding apparatus according to claim 1, wherein the data is digital data generated by converting a reproduced, waveform-equalized RF signal by analog-to-digital converting means, the decoded-bit determining means determines whether the decoded bit is the first logic level or the second logic level by comparing the levels of two data items with the threshold level which is a center level of the amplitude of the digital data, and the decoded-bit determining means determines whether the decoded bit is the first logic level or the second logic level by comparing a sum of the two data items with the threshold level when the digital data has a level equal to the threshold level.

5. The data-decoding apparatus according to claim 4, designed for use in a data-reproducing apparatus for reproducing data from a recording medium in which a code is recorded, said code having a minimum length d' of identical symbols, represented as d'=d+1, where d is a minimum length of consecutive second logic levels interposed between two first logic levels, said identical symbols having been obtained by NRZI modulation and including a symbol satisfying the condition of d=1.

6. The data-decoding apparatus according to claim 5, wherein the decoded-bit determining means sets the decoded bit at the first logic level when the sum of the two data items respectively preceding and following the data is higher than the threshold level.

7. The data-decoding apparatus according to claim 5, wherein the decoded-bit determining means sets the decoded bit at the second logic level when the sum of the two data items respectively preceding and following the data is lower than the threshold level.

8. The data-decoding apparatus according to claim 5, wherein the decoded-bit determining means sets the decoded bit at the first logic level or the second logic level when the sum of the two data items respectively preceding and following the data is equal to the threshold level.

9. A data-decoding method of decoding a bit by comparing the level of input data with a threshold level, thereby generating a decoded bit, comprising:

determining whether the decoded bit is a first logic level or a second logic level from the levels of two data items respectively preceding and following the input data, when the level of the input data is equal to the threshold level, whereby the method is designed for use in a data-reproducing apparatus for reproducing data from a recording medium in which a code is recorded, said code having a minimum length d' of identical symbols, represented as d'=d+1, where d is a minimum length of consecutive second logic levels interposed between two first logic levels, said identical symbols having been obtained by NRZI modulation and including a symbol satisfying the condition of d=1.

10. A data decoding apparatus comprising:

an A/D converter configured to output successive digital data, including a current data, a previous data occurring before the current data, and a following data occurring after the current data; and a data detector connected to the A/D converter and configured to compare the digital data with a comparator level and output a decoded bit, including a data corrector configured to output a decoded bit based on values of the preceding data and the following data when the current data is equal to the comparator level, the data corrector being configured to detect a sum of the previous data and the following data and to output as the decoded bit a first logic level when the sum is positive and a second logic level when the sum is negative.

* * * * *

UNITED STATES PATENT AND TRADEMARK OFFICE
CERTIFICATE OF CORRECTION

PATENT NO. : 6,597,295 B1  
DATED : July 22, 2003  
INVENTOR(S) : Mariko Fukuyama It is certified that error appears in the above-identified patent and that said Letters Patent is hereby corrected as shown below:

Column 2,  
Line 3, change "perpendicular to thereto" to -- perpendicular thereto --.

Column 4,  
Line 55, change "wavefonn" to -- waveform --.

Column 5,  
Line 41, change "sun" to -- sum --.

Column 8,  
Line 33, change "moves" to -- move --.

Column 9,  
Line 19, change "bit" to -- bits --.

Signed and Sealed this

Twenty-fourth Day of February, 2004

JON W. DUDAS  
*Acting Director of the United States Patent and Trademark Office*